US012453017B2

(12) United States Patent
Lee et al.

(10) Patent No.: US 12,453,017 B2
(45) Date of Patent: Oct. 21, 2025

(54) ELECTRONIC DEVICE INCLUDING BATTERY

(71) Applicant: Samsung Electronics Co., Ltd., Gyeonggi-do (KR)

(72) Inventors: Chungik Lee, Gyeonggi-do (KR); Gunhee Park, Gyeonggi-do (KR); Sengtai Lee, Gyeonggi-do (KR); Seokmin Jang, Gyeonggi-do (KR); Cheongno Yun, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 214 days.

(21) Appl. No.: 18/235,089

(22) Filed: Aug. 17, 2023

(65) Prior Publication Data
US 2024/0064912 A1 Feb. 22, 2024

Related U.S. Application Data

(63) Continuation of application No. PCT/KR2023/012219, filed on Aug. 17, 2023.

(30) Foreign Application Priority Data

Aug. 17, 2022 (KR) .................. 10-2022-0102588
Sep. 22, 2022 (KR) .................. 10-2022-0120295

(51) Int. Cl.
H05K 5/00 (2025.01)
H05K 1/11 (2006.01)
(Continued)

(52) U.S. Cl.
CPC ........... *H05K 5/0047* (2013.01); *H05K 1/118* (2013.01); *H05K 1/147* (2013.01); *H05K 3/4644* (2013.01);
(Continued)

(58) Field of Classification Search
CPC .... H05K 5/0047; H05K 5/0247; H05K 1/118; H05K 1/147
(Continued)

(56) References Cited

U.S. PATENT DOCUMENTS

2014/0225806 A1  8/2014 Lee et al.
2016/0234939 A1  8/2016 Kim et al.
(Continued)

FOREIGN PATENT DOCUMENTS

CN   210866339 U  *  6/2020  .............. H01M 2/20
CN   114500697 A  *  5/2022  .......... H04M 1/0264
(Continued)

OTHER PUBLICATIONS

International Search Report dated Nov. 20, 2023.

*Primary Examiner* — Hung S. Bui
(74) *Attorney, Agent, or Firm* — Cha & Reiter, LLC

(57) ABSTRACT

According to certain embodiments, an electronic device comprising a housing; a first printed circuit board disposed in the housing; a second printed circuit board disposed in the housing; a battery disposed between the first printed circuit board and the second printed circuit board; a connection member disposed along one side surface of the battery, and electrically connecting the first printed circuit board and the second printed circuit board; a protection circuit module disposed along the one side surface of the battery and over the connection member; and a first flexible printed circuit board disposed adjacent to the protection circuit module and connected with the first printed circuit board or the second printed circuit board.

19 Claims, 10 Drawing Sheets

(51) Int. Cl.
*H05K 1/14* (2006.01)
*H05K 3/46* (2006.01)
*H05K 5/02* (2006.01)

(52) U.S. Cl.
CPC . *H05K 5/0247* (2013.01); *H05K 2201/10037* (2013.01); *H05K 2201/2027* (2013.01)

(58) Field of Classification Search
USPC ............................ 361/752, 728, 796, 800
See application file for complete search history.

(56) References Cited

U.S. PATENT DOCUMENTS

| | | | |
|---|---|---|---|
| 2016/0261017 A1* | 9/2016 | Kato | ................... H01P 3/08 |
| 2018/0288889 A1 | 10/2018 | Fordham et al. | |
| 2020/0036198 A1 | 1/2020 | Kim et al. | |
| 2022/0302545 A1 | 9/2022 | Jang et al. | |
| 2023/0179020 A1 | 6/2023 | Kim et al. | |

FOREIGN PATENT DOCUMENTS

| | | |
|---|---|---|
| JP | 2016-31811 A | 3/2016 |
| KR | 10-0555232 B1 | 2/2006 |
| KR | 10-0926717 B1 | 11/2009 |
| KR | 10-2013-0013842 A | 2/2013 |
| KR | 10-1466605 B1 | 11/2014 |
| KR | 10-2020-0012105 A | 2/2020 |
| KR | 10-2022-0012591 A | 2/2022 |
| KR | 10-2022-0015708 A | 2/2022 |
| KR | 10-2022-0109836 A | 8/2022 |
| WO | 2018/218658 A1 | 12/2018 |

\* cited by examiner

ELECTRONIC DEVICE INCLUDING BATTERY

CROSS-REFERENCE TO RELATED APPLICATIONS

This application is a continuation of International Application No. PCT/KR2023/012219 filed on Aug. 17, 2023, designating the United States, in the Korean Intellectual Property Receiving Office, and claiming priority to Korean Patent Application No. 10-2022-0102588 filed on Aug. 17, 2022, and Korean Patent Application No. 10-2022-0120295 filed on Sep. 22, 2022, the disclosures of which are all hereby incorporated by reference herein in their entireties.

BACKGROUND

1. Technical Field

An embodiment of the present invention relates to an electronic device including a battery.

2. Description of Related Art

Advancing information communication technology and semiconductor technology accelerate the spread and use of various electronic devices. In particular, recent electronic devices are being developed to carry out communication while carried on. Further, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling and e-wallet function. Such electronic devices become compact enough for users to carry in a convenient way.

Alongside the trend of downsizing electronic devices, vigorous research efforts are being made to increase battery life or capacity to allow for longer use by the electronic device. Further, it may be important to protect the battery from such risk as overcharge and overdischarge as well as increase battery life or capacity. To that end, the battery may include a protection circuit module (PCM). The protection circuit module (PCM) may be provided to perform the functions of preventing overcharge and over discharge and cutting off overcurrent, and protecting against short circuit.

SUMMARY

According to various embodiments of the disclosure, an electronic device may comprise a housing; a first printed circuit board mounted in the housing; a second printed circuit board mounted in the housing; a battery disposed between the first printed circuit board and the second printed circuit board; a connection member disposed along one side surface of the battery, disposed between the first printed circuit board and the second printed circuit board, and configured to electrically connect the first printed circuit board and the second printed circuit board; a protection circuit module disposed along the one side surface of the battery and disposed to overlap over the connection member; and a first flexible printed circuit board disposed adjacent to the protection circuit module and connected with the first printed circuit board or the second printed circuit board.

According to various embodiments of the disclosure, an electronic device may comprise a housing; a first printed circuit board mounted in the housing; a second printed circuit board mounted in the housing; a battery disposed between the first printed circuit board and the second printed circuit board; a connection member disposed along one side surface of the battery, disposed between the first printed circuit board and the second printed circuit board, and configured to electrically connect the first printed circuit board and the second printed circuit board; and a protection circuit module disposed along the one side surface of the battery and disposed to overlap over the connection member.

According to various embodiments of the disclosure, an electronic device may comprise a housing; a first printed circuit board mounted in the housing; a second printed circuit board mounted in the housing; a battery disposed between the first printed circuit board and the second printed circuit board; a connection member disposed along one side surface of the battery, disposed between the first printed circuit board and the second printed circuit board, and configured to electrically connect the first printed circuit board and the second printed circuit board; a protection circuit module disposed along the one side surface of the battery and disposed to overlap over the connection member; and a first flexible printed circuit board disposed adjacent to the protection circuit module and connected with the first printed circuit board or the second printed circuit board. The electronic device may further comprise a second flexible printed circuit board connected with one end of the protection circuit module and third flexible printed circuit board connected with another end of the protection circuit module. The second flexible printed circuit board and the third flexible printed circuit board may include a VBUS terminal.

DETAILED DESCRIPTION

Figure 1:
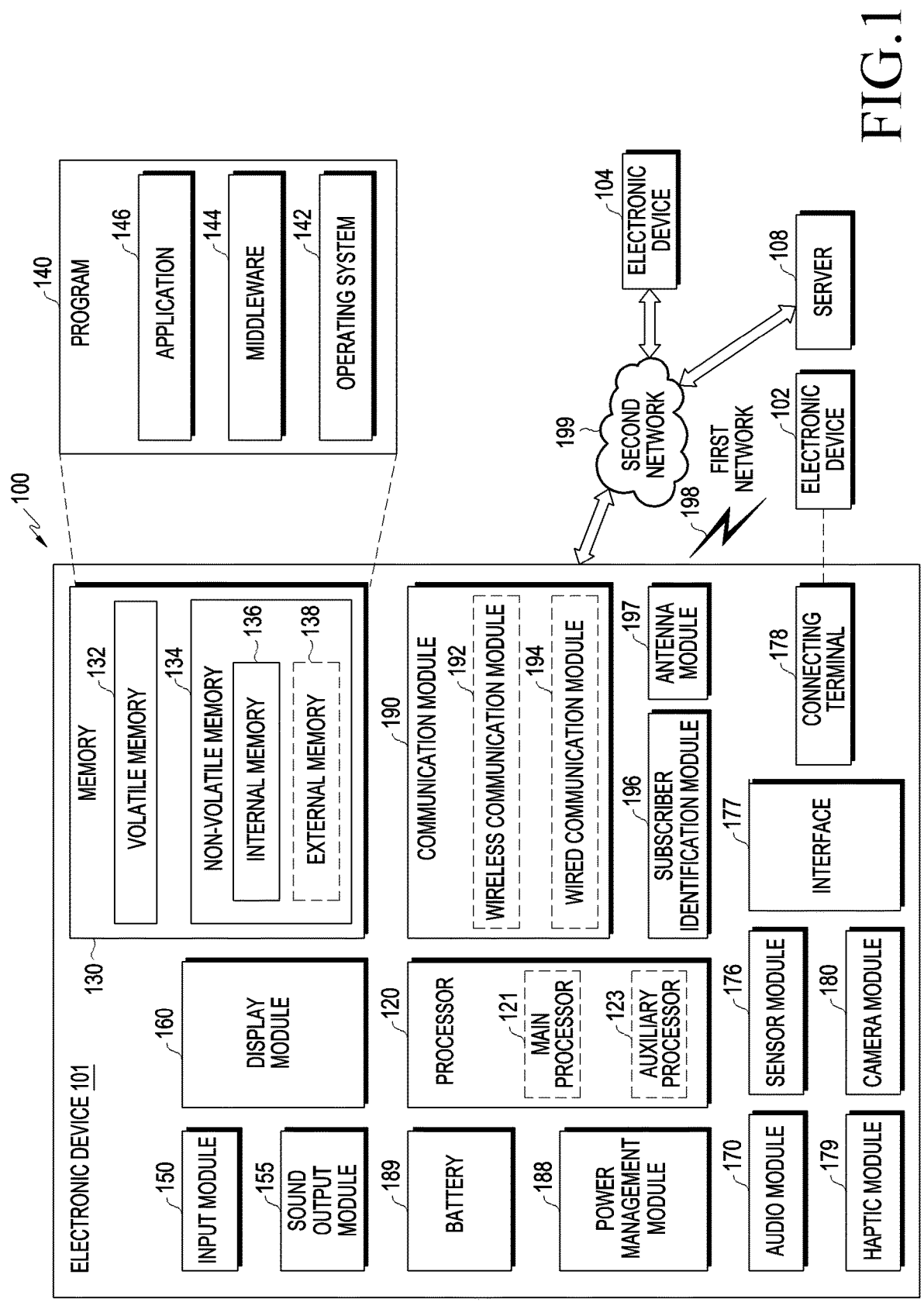
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160). The processor 120 may execute, for example, software (e.g., a program 140) to control at least one other component (e.g., a hardware or software component) of the electronic device 101 coupled with the processor 120, and may perform data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or a sub processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the sub processor 123, the sub processor 123 may be configured to use lower power than the main processor 121 or to be specified for a designated function. The sub processor 123 may be implemented as separate from, or as part of the main processor 121.

The sub processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the sub processor 123 (e.g., an image signal processor or a communication processor) may be implemented as part of another component (e.g., the camera module 180 or the communication module 190) functionally related to the auxiliary processor 123. According to an embodiment, the sub processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support a requirement specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to an embodiment, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to an embodiment of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
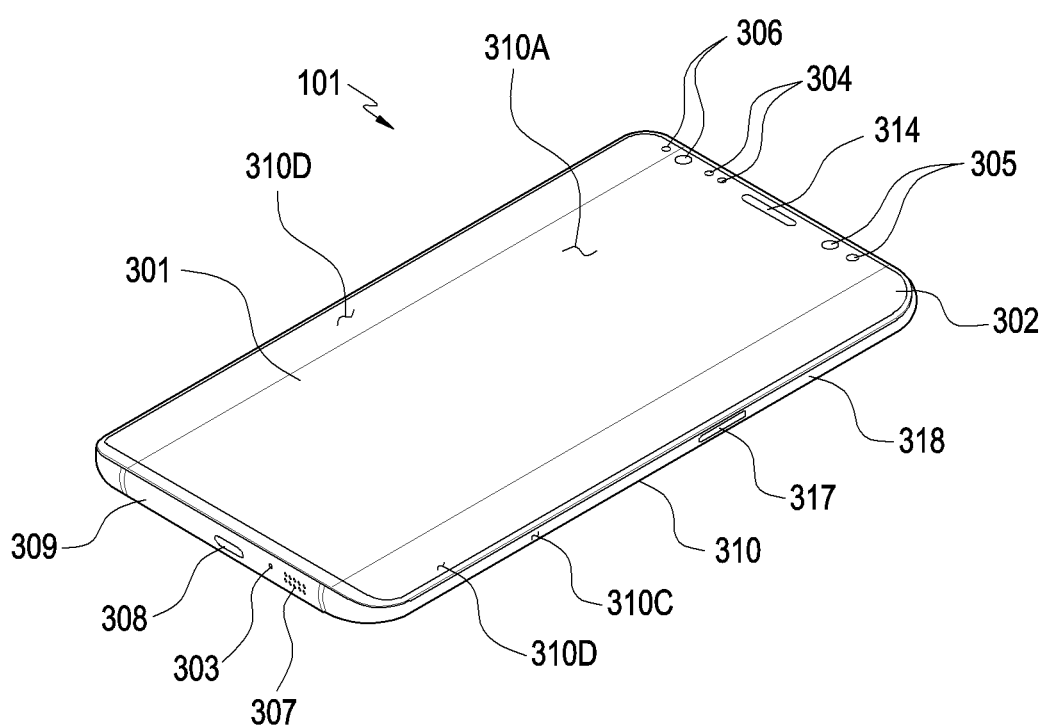
FIG. 2 is a front perspective view illustrating an electronic device according to various embodiments of the disclosure.
Figure 3:
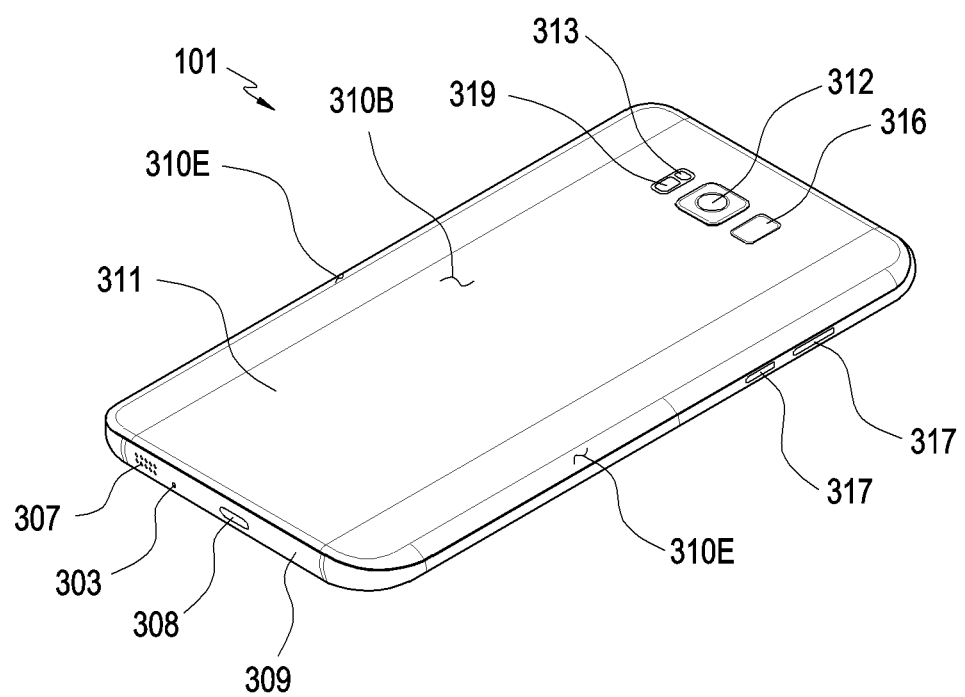
FIG. 3 is a rear perspective view illustrating an electronic device according to various embodiments of the disclosure.

Referring to FIGS. 2 and 3, according to an embodiment, an electronic device 101 may include a housing 310 with a first (or front) surface 310A, a second (or rear) surface 310B, and a side surface 310C surrounding a space between the first surface 310A and the second surface 310B. According to another embodiment (not shown), the housing 310 may denote a structure forming part of the first surface 310A, the second surface 310B, and the side surface 310C of FIG. 2. According to an embodiment, at least part of the first surface 310A may have a substantially transparent front plate 302 (e.g., a glass plate or polymer plate including various coat layers). The second surface 310B may be formed by a rear plate 311 that is substantially opaque. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., a metal, such as aluminum).

In the embodiment illustrated, the front plate 302 may include two first regions 310D, which seamlessly and bendingly extend from the first surface 310A to the rear plate 311, on both the long edges of the front plate 302. In the embodiment (refer to FIG. 3) illustrated, the rear plate 311 may include two second regions 310E, which seamlessly and bendingly extend from the second surface 310B to the front plate, on both the long edges. According to an embodiment, the front plate 302 (or the rear plate 311) may include only one of the first regions 310 (or the second regions 310E). According to another embodiment, the first regions 310D or the second regions 301E may partially be excluded. According to an embodiment, at side view of the electronic device 101, the side bezel structure 318 may have a first thickness (or width) for sides that do not have the first regions 310D or the second regions 310E and a second thickness, which is smaller than the first thickness, for sides that have the first regions 310D or the second regions 310E.

According to an embodiment, the electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. According to an embodiment, the electronic device 101 may exclude at least one (e.g., the key input device 317 or the light emitting device 306) of the components or may add other components.

According to an embodiment, the display 301 may be visually revealed through, e.g., a majority portion of the front plate 302. According to an embodiment, at least a portion of the display 301 may be exposed through the front plate 302 forming the first surface 310A and the first regions 310D of the side surface 310C. According to an embodiment, the edge of the display 301 may be formed to be substantially the same in shape as an adjacent outer edge of the front plate 302. According to another embodiment (not shown), the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the front surface 310A and first areas 310D.

According to an embodiment (not shown), the screen display region of the display 301 may have a recess or opening in a portion thereof, and at least one or more of the audio module 314, sensor module 304, camera module 305, and light emitting device 306 may be aligned with the recess or opening. According to another embodiment (not shown), at least one or more of the audio module 314, sensor module 304, camera module 305, fingerprint sensor 316, and light emitting device 306 may be included on the rear surface of the screen display area of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the sensor modules 304 and 519 and/or at least part of the key input device 317 may be disposed in the first regions 310D and/or the second regions 310E.

According to an embodiment, the audio modules 303, 307, and 314 may include a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. In some embodiments, the speaker holes 307 and 314 and the microphone hole 303 may be implemented as a single hole, or a speaker may be included without the speaker holes 307 and 314 (e.g., a piezo speaker).

According to an embodiment, the sensor modules 304, 316, and 319 may generate an electrical signal or data value corresponding to an internal operating state or external environmental state of the electronic device 101. For example, the sensor modules 304, 316, and 319 may include a first sensor module 304 (e.g., a proximity sensor) and/or a second sensor module (not shown) (e.g., a fingerprint sensor), which is disposed on the first surface 310A of the housing 310, and/or a third sensor module 319 (e.g., a heartrate monitor (HRM) sensor) and/or a fourth sensor module 316 (e.g., a fingerprint sensor) disposed on the second surface 310B of the housing 310. The fingerprint sensor may be disposed on the second surface 310B as well as the first surface 310A (e.g., the display 301) of the housing 310. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304.

According to an embodiment, the camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telephoto lens) and image sensors may be disposed on one surface of the electronic device 101.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the plurality of camera modules 305 and 312 may form, for example, a wide-angle camera and at least another of the plurality of camera modules may form a telephoto camera. Similarly, at least one of the plurality of camera modules 305 and 312 may be a front camera and at least another of the plurality of camera modules may be a rear camera. Further, the plurality of camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the camera module 305 and/or the sensor module may be disposed to contact the external environment through a transparent area from the internal space of the electronic device 101 to the front plate 302 of the display 301. Further, some sensor module (not shown) may be disposed to perform its functions without being visually exposed through the front plate 302 in the internal space of the electronic device.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device 317 may include the sensor module 316 disposed on the second surface 310B of the housing 310.

According to an embodiment, the light emitting device 306 may be disposed on the first surface 310A of the housing 310, for example. The light emitting device 306 may provide, e.g., information about the state of the electronic device 101 in the form of light. According to an embodiment, the light emitting device 306 may provide a light source that interacts with, e.g., the camera module 305. The light emitting device 306 may include, e.g., a light emitting diode (LED), an infrared (IR) LED, or a xenon lamp.

The connector holes 308 and 309 may include a first connector hole 308 for receiving a connector (e.g., a universal serial bus (USB) connector) for transmitting or receiving power and/or data to/from an external electronic device and/or a second connector hole 309 (e.g., an earphone jack) for receiving a connector for transmitting or receiving audio signals to/from the external electronic device.

Figure 4:
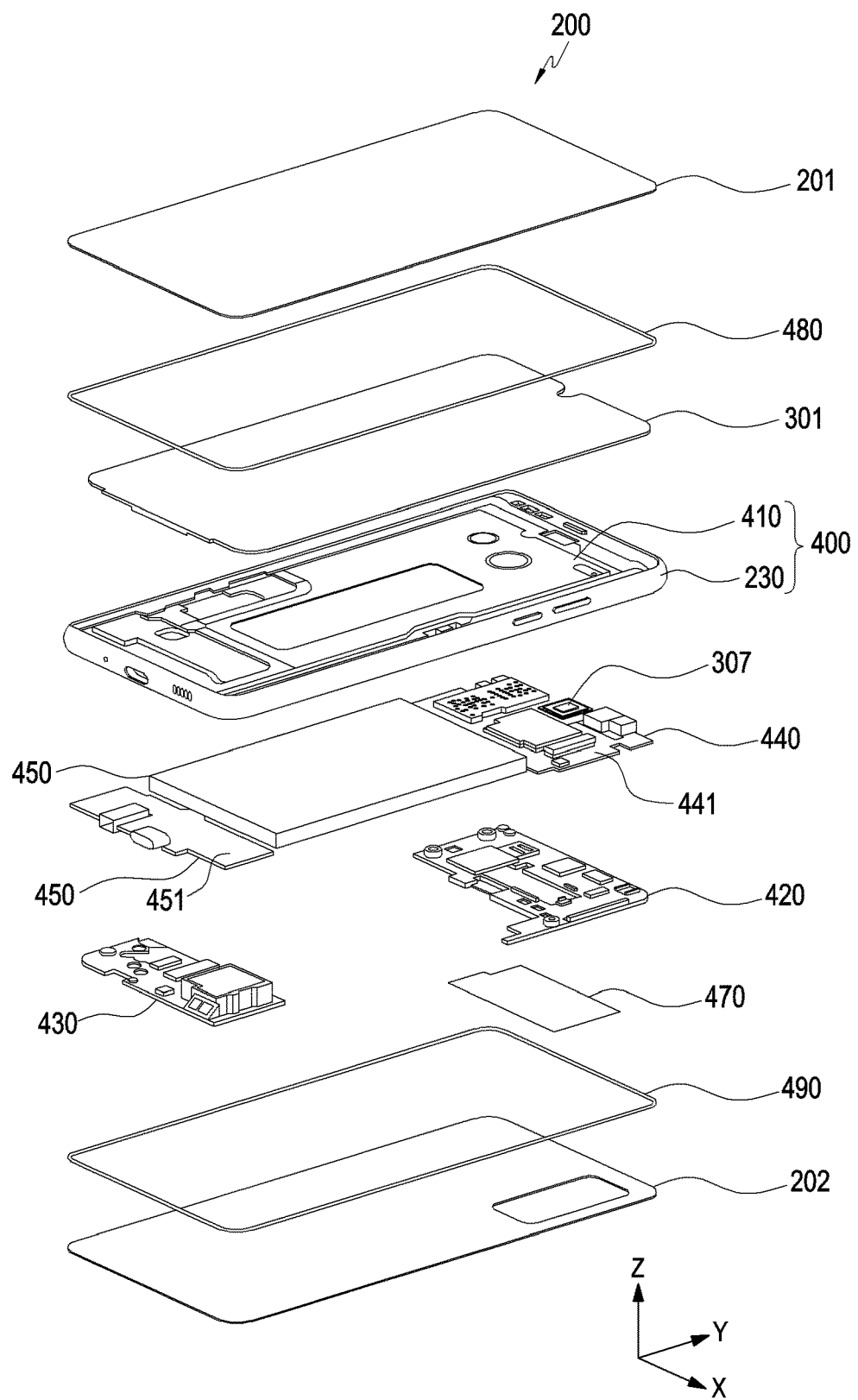
FIG. 4 is an exploded perspective view illustrating an electronic device according to various embodiments of the disclosure.

FIG. 4 is an exploded perspective view illustrating an electronic device 200 according to an embodiment.

Referring to FIG. 4, in an embodiment, an electronic device 200 may include a front plate 201, a rear plate 202, a side member 203, a first supporting member 410, a second supporting member 420, a third supporting member 430, a display 301, a first substrate assembly 440, a second substrate assembly 450, a battery 460, an antenna structure 470, a first adhesive member 480, and/or a second adhesive member 490. According to an embodiment, the electronic device 200 may omit at least one (e.g., the second supporting member 420 or the third supporting member 430) of the components or may add other components. At least one of the components of the electronic device 200 may be the same or similar to at least one of the components of the electronic device 101 of FIGS. 1 to 3 and no duplicate description is made below.

According to an embodiment, the first supporting member 410 may be, e.g., positioned in the electronic device 200 and connected with the side member 203 or integrally formed with the side member 203. The first supporting member 410 may be formed of, e.g., a metallic material and/or non-metallic material (e.g., polymer). In an embodiment, the conductive portion included in the first supporting member 410 may serve as an electromagnetic shield for the display 301, the first substrate assembly 440, and/or the second substrate assembly 450. The first supporting member 410 and the side member 203 together may be referred to as a front case 400. The first supporting member 410 is a part of the front case 400 where components, such as the display 301, the first substrate assembly 440, the second substrate assembly 450, or the battery 460, are disposed, and may contribute to durability or rigidity (e.g., torsional rigidity) of the electronic device 200. In an embodiment, the first supporting member 410 may be referred to as a bracket, mounting plate, or supporting structure.

According to an embodiment, the display 301 may be, e.g., positioned between the first supporting member 410 and the front plate 201 and be disposed on one surface of the first supporting member 410. The first substrate assembly 440 and the second substrate assembly 450 may be, e.g., positioned between the first supporting member 410 and the rear plate 202 and be disposed on the other surface of the first supporting member 410. The battery 460 may be, e.g., positioned between the first supporting member 410 and the rear plate 202 and be disposed on the first supporting member 410.

According to an embodiment, the first substrate assembly 440 may include a first printed circuit board 441 (e.g., printed circuit board (PCB), or printed circuit board assembly (PBA)). The first substrate assembly 440 may include various electronic components electrically connected to the first printed circuit board 441. The electronic components may be disposed on the first printed circuit board 441 or electrically connected to the first printed circuit board 441 through an electrical path, such as a cable or a flexible printed circuit board (FPCB). Referring to FIGS. 2 and 3, the electronic components may include, e.g., a second microphone included in the second audio module 303, a second speaker included in the fourth audio module 305, a sensor module 306, a first camera module 307, a plurality of second camera modules 308, a light emitting module 309, or an input module 310.

According to an embodiment, when viewed from above the front plate 201 (e.g., when viewed in the −z-axis direction), the second substrate assembly 450 may be spaced apart from the first substrate assembly 440 with the battery 460 interposed therebetween. The second substrate assembly 450 may include a second printed circuit board 451 electrically connected to the first printed circuit board 441 of the first substrate assembly 440. The second board assembly 450 may include various electronic components electrically connected to the second printed circuit board 451. The electronic components may be disposed on the second printed circuit board 451 or electrically connected to the first printed circuit board 441 through an electrical path, such as a cable or an FPCB. Referring to FIGS. 2 and 3, the electronic components may include, e.g., a first microphone included in the first audio module 302, a first speaker included in the third audio module 304, or a connector included in the connecting terminal module 311.

According to an embodiment, a processor, a memory, and/or an interface may be mounted on the printed circuit board (e.g., the first printed circuit board 441 and/or the second printed circuit board 451). The processor may include one or more of, e.g., a central processing unit, an application processor, a graphic processing device, an image signal processing, a sensor hub processor, or a communication processor. According to an embodiment, the printed circuit board (e.g., the first circuit board 441 and/or the second printed circuit board 451) may include a flexible printed circuit board type radio frequency cable (FRC). For example, the printed circuit board (e.g., the first circuit board 441 and/or the second printed circuit board 451) may be disposed on at least a portion of the first supporting member 332 and may be electrically connected with an antenna module (e.g., the antenna module 197 of FIG. 1) and a communication module (e.g., the communication module 190 of FIG. 1).

According to an embodiment, the first board assembly 440 or the second board assembly 450 may include a primary PCB (or main PCB or master PCB), a secondary PCB (or slave PCB) disposed to partially overlap the primary PCB, and may further include an interposer substrate between the primary PCB and the secondary PCB.

According to an embodiment, the memory may include, e.g., a volatile or non-volatile memory.

According to an embodiment, the interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment, the battery 460 may be a device for supplying power to at least one component of the electronic device 200. The battery 189 may include, e.g., a primary cell which is not rechargeable, a secondary cell which is rechargeable, or a fuel cell. At least a portion of the battery 460 may be disposed on substantially the same plane as the printed circuit board 340. The battery 460 may be integrally or detachably disposed inside the electronic device 200.

According to an embodiment, the second supporting member 420 may be positioned between the first supporting member 410 and the rear plate 202 and may be coupled to the first supporting member 410 by a fastening element, such as a screw (or bolt). At least a portion of the first substrate assembly 440 may be positioned between the first supporting member 410 and the second supporting member 420. The second supporting member 420 may cover and protect the first substrate assembly 440. When viewed from above the rear plate 202 (e.g., when viewed in the +z-axis direction), the third supporting member 430 may be at least partially spaced apart from the second supporting member 420 with the battery 460 disposed therebetween. The third supporting member 430 may be positioned between the first supporting member 410 and the rear plate 202 and may be coupled to the first supporting member 410 by a fastening element, such as a bolt. At least a portion of the second substrate assembly 450 may be positioned between the first supporting member 410 and the third supporting member 430. The third supporting member 430 may cover and protect the second substrate assembly 450. The second supporting member 420 and/or the third supporting member 430 may be formed of a metal material and/or a non-metal material (e.g., polymer). In an embodiment, the second supporting member 420 may serve as an electromagnetic shield for the first substrate assembly 440 and the third supporting member 430 may serve as an electromagnetic shield for the second substrate assembly 450. In an embodiment, the second supporting member 420 and/or the third supporting member 430 may be referred to as a rear case.

According to an embodiment, an integral substrate assembly including the first substrate assembly 440 and the second substrate assembly 450 may be implemented. For example, when viewed from above the rear plate 202 (e.g., when viewed in the +z-axis direction), the substrate assembly may include a first portion and a second portion spaced apart from each other with the battery 460 disposed therebetween and a third portion connecting the first portion and the second portion while extending between the battery 460 and the side bezel structure 203. The third portion may be implemented substantially rigidly. In an embodiment, the third portion may be implemented substantially flexibly. In an embodiment, an integral supporting member including the second supporting member 420 and the third supporting member 430 may be implemented.

According to an embodiment, the antenna structure 470 may be positioned between the second supporting member 420 and the rear plate 202. In an embodiment, antenna structure 470 may be positioned between the battery 460 and the rear plate 202. The antenna structure 470 may be implemented in the form of a film, such as FPCB. The antenna structure 470 may include at least one conductive pattern utilized as a loop-type radiator. For example, the at least one conductive pattern may include a planar spiral conductive pattern (e.g., a planar coil or a pattern coil). In an embodiment, the at least one conductive pattern included in the antenna structure 470 may be electrically connected to a wireless communication circuit (or wireless communication module) included in the first substrate assembly 440. For example, the at least one conductive pattern may be utilized for short-range wireless communication, such as near field communication (NFC). As another example, at least one conductive pattern may be used for magnetic secure transmission (MST) for transmitting and/or receiving a magnetic signal. In an embodiment, at least one conductive pattern included in the antenna structure 470 may be electrically connected to a power transmission/reception circuit included in the first substrate assembly 440. The power transmission/reception circuit may wirelessly receive power from an external electronic device or wirelessly transmit power to the external electronic device through at least one conductive pattern. The power transmission/reception circuit may include a power management module, e.g., a power management integrated circuit (PMIC) or a charger integrated circuit (IC). The power transmission/reception circuit may charge the battery 460 with the power wirelessly received through the conductive pattern.

According to an embodiment of the disclosure, the antenna structure 470 may include a plurality of antenna modules. For example, some of the plurality of antenna modules may be implemented to transmit or receive radio waves with different characteristics (referred to as radio waves of frequency bands A and B) to implement MIMO. As another example, some of the plurality of antenna modules may be configured to simultaneously transmit or receive radio waves with the same characteristic (referred to as radio waves of frequencies A1 and A2 in frequency band A) to implement diversity. As another example, some of the plurality of antenna modules may be configured to simultaneously transmit or receive radio waves with the same characteristic (referred to as radio waves of frequencies B1 and B2 in frequency band B) to implement diversity. According to an embodiment, two antenna modules may be included. Alternatively, the electronic device 101 may include four antenna modules to implement both MIMO and diversity. According to another embodiment, the electronic device 101 may include only one antenna module.

According to an embodiment, given the transmission and reception nature of radio waves, when one antenna module is disposed in a first position of the antenna structure 470, another antenna module may be disposed in a second position, which is separated from the first position, of the antenna structure 470. As another example, one antenna module and another antenna module may be disposed considering the distance therebetween depending on diversity characteristics.

According to an embodiment, at least one antenna module may include a wireless communication circuit to process radio waves transmitted or received in a high frequency band (e.g., 6 GHz or more and 300 GHz or less). The conductive plate of the at least one antenna module may be formed of a dipole-structured conductive plate extending in one direction or a patch-type radiating conductor. A plurality of conductive plates may be arrayed to form an antenna array. A chip (e.g., an integrated circuit (IC) chip) in which part of the wireless communication circuit is implemented may be disposed on the opposite surface of the surface where the conductive plate is disposed or on one side of the area where the conductive plate is disposed and may be electrically connected with the conductive plate via a line which is formed of a printed circuit pattern.

According to an embodiment, the first adhesive member 480 may be positioned between the front plate 201 and the first supporting member 410. The front plate 201 may be coupled to the first supporting member 410 by the first adhesive member 480. For example, the first adhesive member 480 may be disposed in an annular shape adjacent to an edge (or border) of the front plate 201. The first adhesive member 480 may be formed in other various shapes without limitations to the example shown. In an embodiment, the first adhesive member 480 may include a plurality of adhesive members separated from each other. In this case, there may be a separate adhesive member or a filling member connecting the two separated adhesive members.

According to an embodiment, the second adhesive member 490 may be positioned between the rear plate 202 and the first supporting member 410. The rear plate 202 may be coupled to the first supporting member 410 by the second adhesive member 490. For example, the second adhesive member 490 may be disposed in an annular shape adjacent to an edge (or border) of the rear plate 202. The second adhesive member 490 may be formed in other various shapes without limitations to the example shown. In an embodiment, the second adhesive member 490 may include a plurality of adhesive members separated from each other. In this case, there may be a separate adhesive member or a filling member connecting the two separated adhesive members.

According to an embodiment, the first adhesive member 480 or the second adhesive member 490 may include various types of adhesive materials, such as a heat-reactive adhesive material, a photo-reactive adhesive material, a general adhesive, or a double-sided tape.

The electronic device 200 may further include various elements according to its provision form. Many variations may be made to the components according to the convergence trend of the electronic device 200, so it is not possible to list them all, but components equivalent to the above-mentioned components may be further included in the electronic device 200. In an embodiment, certain components may be excluded from the above components or replaced with other components according to the form of provision.

The electronic device 101 disclosed in the disclosure has a bar-type or plate-type appearance but the disclosure is not limited thereto. For example, the illustrated electronic device 101 may be a rollable electronic device or a foldable electronic device. As the display is stretched out or is exposed to the outside in a larger area according to the user's need, the rollable electronic device or foldable electronic device may use an expanded second display area. In some embodiments, according to various embodiments of the disclosure, the electronic device 101 may be interpreted as including various electronic devices, such as a laptop computer or a camera, as well as a portable electronic device, such as a smart phone.

Figure 5:
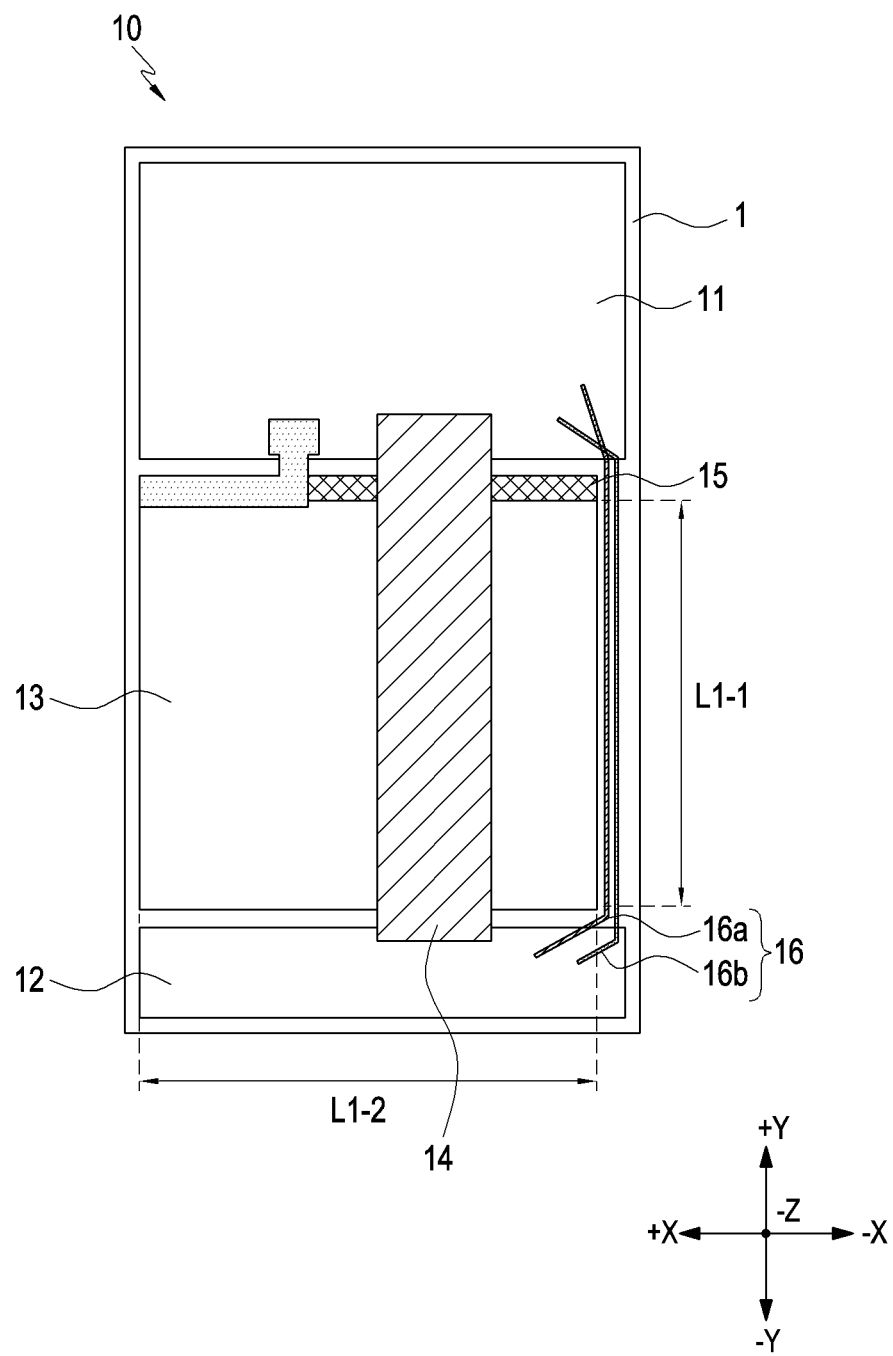
FIG. 5 is an xy-plane rear view illustrating an electronic device according to an embodiment.

FIG. 5 is an xy-plane rear view illustrating an electronic device 10 according to an embodiment.

Referring to FIG. 5, an electronic device 10 may include a housing 1, a first printed circuit board 11 mounted in the housing 1, a second printed circuit board 12, a first flexible printed circuit board 14 connecting the first printed circuit board 11 and the second printed circuit board 12, a battery 13 disposed between the first printed circuit board 11 and the second printed circuit board 12, a protection circuit module (PCM) 15 to previously cut off overcharge, overdischarge, and overcurrent of the battery 13 to protect the battery, and a connection member 16 electrically connecting the first printed circuit board 11 and the second printed circuit board 12.

Referring to FIG. 5, the configuration of the first printed circuit board 11 and the second printed circuit board 12 of FIG. 5 may be identical in whole or part to the configuration of the first substrate assembly 440 or the first printed circuit board 441, the second substrate assembly 450, or the second printed circuit board 451 of FIG. 4. The structure of FIG. 5 may be selectively combinable with the structures of FIGS. 2 to 4.

FIG. 5 illustrates a spatial coordinate system defined by an X-axis, a Y-axis and a Z-axis orthogonal to each other. Here, the X axis may indicate a width direction of the electronic device 10, the Y axis may indicate a length direction (or length direction) of the electronic device 10, and the Z axis may indicate a thickness direction of the electronic device 10.

According to an embodiment, the first printed circuit board 11 may be electrically connected to various electronic components. Referring to FIG. 2, the electronic components electrically connected with the first printed circuit board 11 may include, e.g., a second microphone included in the second audio module 303, a second speaker included in the fourth audio module 305, a sensor module 306, a first camera module 307, a plurality of second camera modules 308, a light emitting module 309, or an input module 310. For example, the first printed circuit board 11 may include a radio frequency (RF) circuit configured to be connected to the connection member 16. According to an embodiment, the first printed circuit board 11 may be mounted in the housing 1. For example, it may be positioned between a supporting member (e.g., first supporting member 410 of FIG. 4) and a rear plate (e.g., rear plate 202 of FIG. 4). For example, it may be disposed in the upper direction (e.g., the +Y-direction of FIG. 5) of the electronic device 10 of FIG. 5. For example, it may be disposed adjacent to the battery 13 and may be disposed on substantially the same plane (e.g., the XY plane of FIG. 5) as the battery 13.

According to an embodiment, the second printed circuit board 12 may be electrically connected to the first printed circuit board 11. According to an embodiment, the second printed circuit board 12 may be electrically connected to various electronic components. The electronic components electrically connected with the second printed circuit board 12 may include, e.g., a first microphone included in the first audio module 302, a first speaker included in the third audio module 304, or a connector included in the connecting terminal module 311. For example, the second printed circuit board 12 may include an antenna connection part configured to be connected to the connection member 16. According to an embodiment, the first printed circuit board 12 may be mounted in the housing 2. For example, it may be positioned between a supporting member (e.g., first supporting member 410 of FIG. 4) and a rear plate (e.g., rear plate 202 of FIG. 4). For example, it may be disposed in the lower direction (e.g., the +Y-direction of FIG. 5) of the electronic device 10 of FIG. 5. For example, it may be disposed adjacent to the battery 13 and may be disposed on substantially the same plane (e.g., the XY plane of FIG. 5) as the battery 13. For example, the second printed circuit board 12 may be spaced apart from the first printed circuit board 11 with the battery 13 disposed therebetween.

According to an embodiment, the battery 13 may supply power to at least one component of the electronic device 10. According to an embodiment, the battery 13 may be positioned between a supporting member (e.g., first supporting member 410 of FIG. 4) and a rear plate (e.g., rear plate 202 of FIG. 4). According to an embodiment, the battery 13 may be disposed between the first printed circuit board 11 and the second printed circuit board 12. For example, at least a portion of the battery 13 may be disposed substantially on the same plane as the printed circuit board (e.g., the first printed circuit board 11 and/or the second printed circuit board 12). For example, the first printed circuit board 11, the battery 13, and the second printed circuit board 12 may be disposed side by side in the Y-axis direction. The battery 13 may be integrally or detachably disposed inside the electronic device 10. According to an embodiment, the size and/or volume of the battery 13 may be affected by the arrangement and/or type of various components disposed around the battery 13. For example, referring to FIG. 5, the height (e.g., length in the Y axis direction of FIG. 5) of the battery 13 according to an embodiment may be 'L1-1'. The width (e.g., length in the X axis direction of FIG. 5) of the battery 13 according to an embodiment may be 'L1-2'. The thickness (e.g., length in the Z axis direction of FIG. 5) of the battery 13 according to an embodiment may be 'L1-3' (not shown). According to an embodiment, the capacity and/or volume of the battery 13 may be enhanced by efficiently arranging various components disposed around the battery 13 to increase the use time of the electronic device 10.

According to an embodiment, the first flexible printed circuit board 14 may electrically connect the first printed circuit board 11 and the second printed circuit board 12. The first flexible printed circuit board 14 may be disposed between the first printed circuit board 11 and the second printed circuit board 12. For example, one end of the first flexible printed circuit board 14 may contact the first printed circuit board 11, and the other end may contact the second printed circuit board 12. In general, the first flexible printed circuit board 14 may be disposed adjacent to the battery 13. For example, the first flexible printed circuit board 14 may face one surface (=front surface) of the battery 13 facing in the −Z-axis direction. As the first flexible printed circuit board 14 is disposed on one surface of the battery 13 and occupies space, if the first flexible printed circuit board 14 is so disposed adjacent to the battery 13 to occupy a separate space, the battery 13 needs to reduce in size. For example, a limitation may be imposed on the length of the battery 13 in the thickness direction (e.g., the Z-axis direction of FIG. 5). This approach may reduce the size or of the battery 13, causing constraints on product design.

According to an embodiment, the protection circuit module (PCM) 15 may perform an overcharge preventing function (Over Charge Protection Voltage), an overdischarge preventing function (Over Discharge Protection Voltage), an overcurrent cutoff function (Over Current Protection/Detection current), and/or a short-circuit protecting function (Short Protection/Detection Condition). In addition to or as an alternative to the functions, the protection circuit module (PCM) 15 may operate as a battery management system (BMS) including the function of monitor information (e.g., charge/discharge status, voltage, temperature, or pressure) about the battery 13 and transmitting the information about the battery 13 via wired/wireless communication or controlling them and the function of managing the remaining capacity, remaining time, and charge/discharge log of the battery 13. According to an embodiment, components for performing the various functions may be mounted on a substrate in the protection circuit module (PCM) 15.

According to an embodiment, the protection circuit module (PCM) 15 may be disposed adjacent to at least one side of the battery 13. According to an embodiment, the positive and negative terminals formed on one side of the battery 13 may be connected to the protection circuit module 15.

According to an embodiment, a terminal unit (not shown) may be formed in the protection circuit module 15. Electrode terminals respectively corresponding to the terminals (e.g., positive terminal and negative terminal) of the battery 13 may be formed. The protection circuit module 15 may appropriately control the charging/discharging function of the battery 13 by at least one electronic component (e.g., PMIC) mounted on the substrate. The protection circuit module 15 may monitor and control information related to power of the battery 13 and transmit the information related to the power to the processor of the electronic device 10 where the battery 13 is disposed. To that end, a connection member, such as FPCB, may be connected to one side of the protection circuit module 15.

According to an embodiment, as the protection circuit module 15 is disposed on one side of the battery 13 and occupies space, the protection circuit module 15 may protrude longer than the length of the battery 13. In an embodiment, the protection circuit module 15 may be disposed in an upper direction (e.g., the Y-axis direction of FIG. 5) of the battery 13. As such, if the protection circuit module 15 is disposed adjacent to the battery 13 and occupies a separate space, the size of the battery 13 may need to be reduced. For example, a limitation may be imposed on the length of the battery 13 in the height direction (e.g., the Y-axis direction of FIG. 5). This approach may reduce the size or of the battery 13, causing constraints on product design.

According to an embodiment, the connection member 16 (e.g., coaxial cable) may be a type of transmission line used for data communication capable of transmitting electrical signals as the outer conductor and the inner conductor form concentric circles. The connection member 16 may transmit electrical signals ranging from low frequencies including direct current to high frequencies of several tens of MHz, for example. According to an embodiment, the connection member 16 may include a first connection member 16*a* and a second connection member 16*b* according to polarities. According to an embodiment, the connection member 16 (e.g., coaxial cable) may electrically connect the antenna module (e.g., the antenna module 197 of FIG. 1) and the printed circuit board (e.g., the first printed circuit board 11 and/or the second printed circuit board 12). For example, the RF circuit of the antenna module may be electrically connected to the printed circuit board through the connection member 16. For example, the RF circuit included in the first printed circuit board 11 may be electrically connected to the antenna connection part included in the second printed circuit board 12 through the connection member 16. According to an embodiment, the connection member 16 may be positioned between the first printed circuit board 11 and the second printed circuit board 12. For example, the connection member 16 may be disposed adjacent to the battery 13 disposed between the first printed circuit board 11 and the second printed circuit board 12. For example, the connection member 16 may be disposed on one side of the battery 13. For example, the connection member 16 may be disposed on the left side (e.g., in the −x-axis direction of FIG. 5) or the right side (e.g., in the +x-axis direction of FIG. 5) of the battery 13. As such, if the connection member 16 is disposed adjacent to the battery 13 and occupies a separate space, the size of the battery 13 may need to be reduced. For example, a limitation may be imposed on the length of the battery 13 in the width direction (e.g., the X-axis direction of FIG. 5). This approach for the battery 13 may reduce the size or of the battery 13, causing constraints on product design.

According to an embodiment, the size of the battery 13 may be limited by the first flexible printed circuit board 14, the protection circuit module, and the connection member 16 disposed around the battery 13. For example, the length in the thickness direction (e.g., Z-axis direction of FIG. 5) of the battery 13 may be limited by the first flexible printed circuit board 14 positioned in the forward direction (e.g., −Z direction of FIG. 5) of the battery 13. For example, the length of the battery 13 in the height direction (e.g., the Y-axis direction of FIG. 5) may be limited by the protection circuit module 15 positioned in the height direction (e.g., the +Y direction of FIG. 5) of the battery 13. For example, the length of the battery 13 in the width direction (e.g., the X-axis direction of FIG. 5) may be limited by the connection member 16 positioned in the width direction (e.g., the +X direction of FIG. 5) of the battery 13.

According to an embodiment of the disclosure, the volume of the battery 13 may be enhanced by minimizing the space created by the first flexible printed circuit board 14, the protection circuit module, and the connection member 16 disposed around the battery 13. This is described below.

Figure 6:
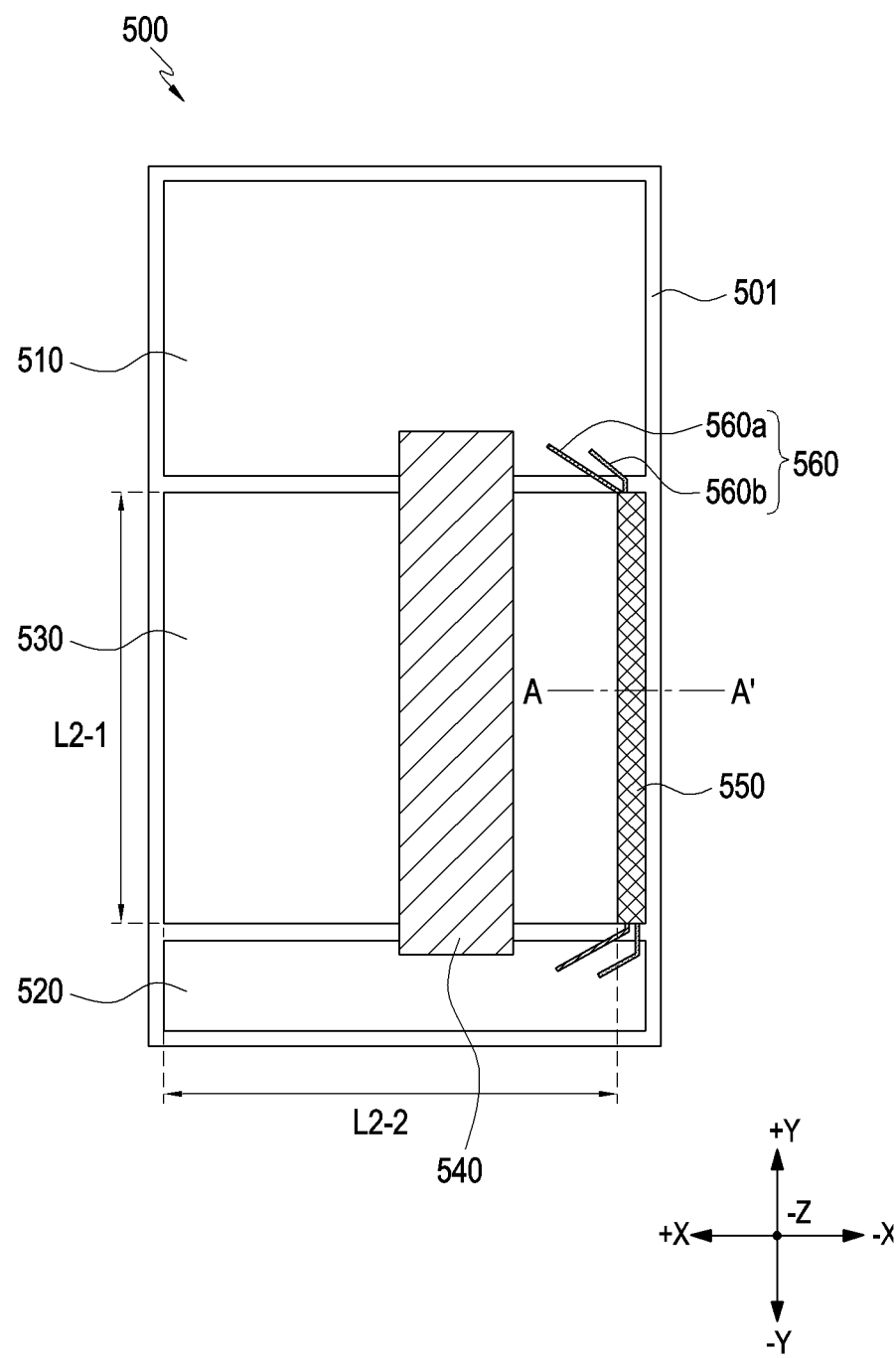
FIG. 6 is an xy-plane rear view illustrating an electronic device according to an embodiment of the disclosure.
Figure 7A:
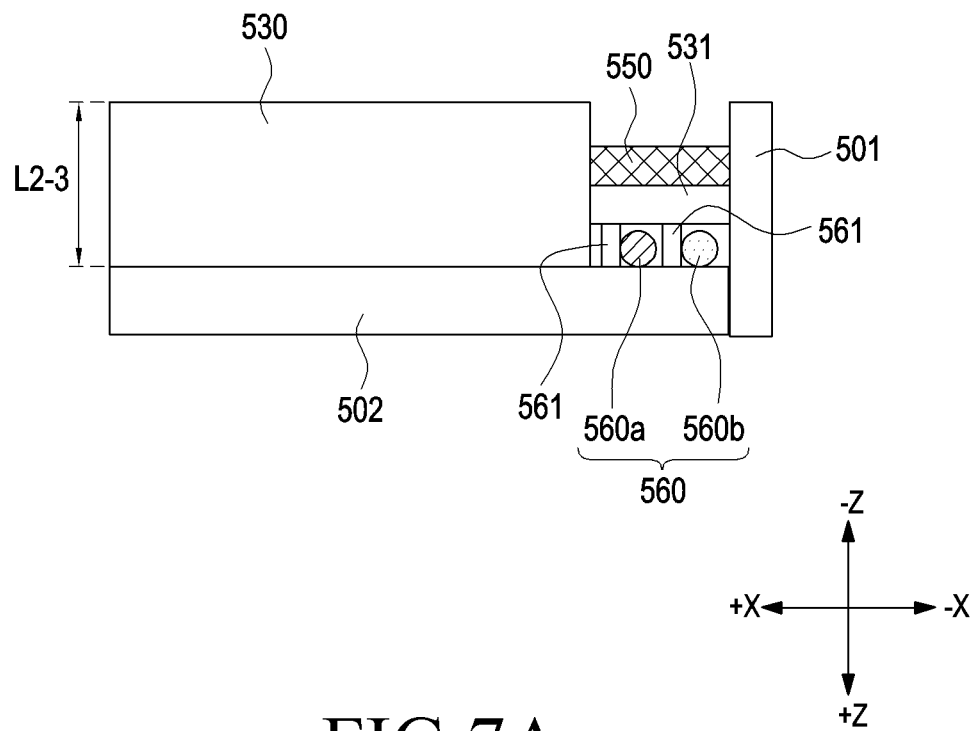
FIGS. 7A and 7B are cross-sectional views taken along line A-A' of the electronic device of FIG. 6 according to an embodiment of the disclosure.
Figure 7B:
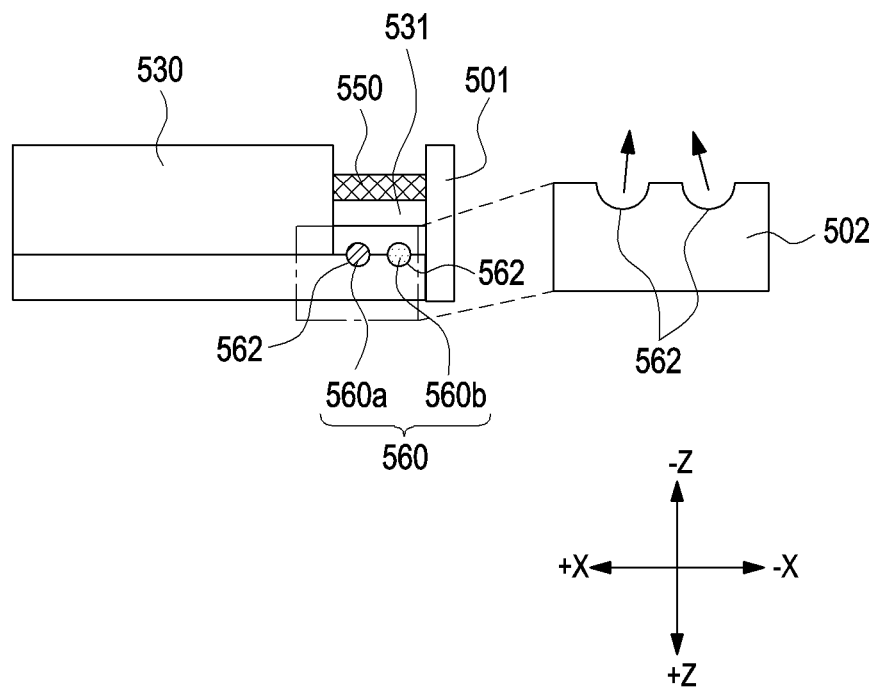

FIG. 6 is an illustration of a longitudinal section of an electronic device 500 according to an embodiment of the disclosure. FIGS. 7A and 7B are cross-sectional views taken along line A-A' of the electronic device 500 of FIG. 6 according to an embodiment of the disclosure.

Referring to FIGS. 6 to 7B, an electronic device 500 may include a housing 501, a first printed circuit board 510 mounted in the housing 501, a second printed circuit board 520, a first flexible printed circuit board 540 connecting the first printed circuit board 510 and the second printed circuit board 520, a battery 530 disposed between the first printed circuit board 510 and the second printed circuit board 520, a protection circuit module (PCM) 550 to previously cut off overcharge, overdischarge, and overcurrent of the battery 530 to protect the battery, and a connection member 560 (e.g., a coaxial cable) electrically connecting the first printed circuit board 510 and the second printed circuit board 520.

Referring to FIGS. 6 to 7B, the configuration of the first printed circuit board 510, the second printed circuit board 520, the first flexible printed circuit board 540, the battery 530, the protection circuit module 550 and the connection member 560 of FIGS. 6 to 7B may be identical in whole or part to the configuration of the first printed circuit board 510, the second printed circuit board 520, the first flexible printed circuit board 540, the battery 530, the protection circuit module 550 and the connection member 560 of FIG. 5. The structure of FIGS. 6 to 7B may be selectively combinable with the structures of FIG. 5.

FIGS. 6 to 7B illustrate a spatial coordinate system defined by an X-axis, a Y-axis and a Z-axis orthogonal to each other. Here, the X axis may indicate a width direction of the electronic device 500, the Y axis may indicate a length direction (or length direction) of the electronic device 500, and the Z axis may indicate a thickness direction of the electronic device 500.

According to an embodiment, referring to FIGS. 7A and 7B, the connection member 560 may be disposed on the supporting member 502 (e.g., the first supporting member 410 of FIG. 4).

According to an embodiment, referring to FIG. 7A, the electronic device 500 may further include a guide 561 for fixing the position of the connection member 560. For example, the guide 561 may be formed by causing a portion of the supporting member 502 to protrude in the −Z-axis direction. The guide 561 may contact the connection member 560. The guide 561 may include a first guide 561 contacting the first connection member 560a and a second guide 561 contacting the second connection member 560b.

According to an embodiment, referring to FIG. 7B, the electronic device 500 may further include a guide 562 for fixing the position of the connection member 560. For example, the guide 562 may have a shape in which a part of the supporting member 502 is concave. The guide 562 may have a shape in which the supporting member 502 in contact with the connection member 560 is concavely formed according to the shape of the connection member 560 in the +Z-axis direction. For example, the guide 562 may have a semicircular shape in which the supporting member area corresponding to the connection member 560 is concave in the +Z-axis direction. The guide 562 may include a guide 562 corresponding to the first connection member 560 and a guide 562 corresponding to the second connection member 560. According to an embodiment, the radius of the cross section of the connection member 560 of the electronic device 500 may be larger than or equal to 0.7 mm and less than or equal to 1 mm. However, the size of the connection member 560 is not limited to the above embodiment, and may be varied depending on the layout and mounting scheme of the electronic device 500.

According to an embodiment, the protection circuit module (PCM) 550 may be disposed adjacent to at least one side of the battery 530. According to an embodiment, the protection circuit module (PCM) 550 may be disposed in a position corresponding to the position where the connection member 560 is disposed. According to an embodiment, the protection circuit module (PCM) 550 may overlap the connection member 560. For example, the protection circuit module (PCM) 550 may be disposed over the connection member 560. For example, the connection member 560 may be disposed over the protection circuit module (PCM) 550. According to an embodiment, the protection circuit module (PCM) 550 may disposed in the width direction (e.g., the X-axis direction of FIG. 6) of the battery 530 and may overlap the connection member 560.

According to an embodiment, the protection circuit module (PCM) 550 may be disposed in a position corresponding to the position where the battery tab 531 in which the positive and negative terminals of the battery 530 are mounted is disposed. According to an embodiment, the protection circuit module (PCM) 550 may overlap the battery tab 531. For example, protection circuit module (PCM) 550 may be disposed over battery tab 531. According to an embodiment, the positive and negative terminals embedded in the battery tab 531 formed on one side of the battery 530 may be connected to the protection circuit module 550. According to an embodiment, the protection circuit module (PCM) 550 may disposed to overlap the battery tab 531 and/or the connection member 560, adjacent in the width direction (e.g., the X-axis direction of FIG. 6) of the battery 530. As the protection circuit module 550 is disposed to overlap the connection member 560 and the battery tab 531, the length of the battery 530 in the height direction (e.g., the Y-axis direction of FIG. 6) may not be limited as compared with FIG. 5. As the protection circuit module 550, the battery tab 531, and the connection member 560 are disposed to overlap adjacent in the width direction (e.g., +X-axis direction of FIG. 6) of the battery 530, the battery 530 may be extended in the height direction (e.g., Y-axis direction of FIG. 6) of the battery 530.

According to an embodiment, the protection circuit module (PCM) 550 may include a connector connecting the protection circuit module (PCM) 550 and the first printed circuit board 510 and/or the second printed circuit board 520 (not shown).

According to an embodiment, referring to FIG. 6, the height (e.g., length in the Y axis direction of FIG. 6) of the battery 530 may be 'L2-1'. The width (e.g., length in the X axis direction of FIG. 6) of the battery 530 according to an embodiment may be 'L2-2'. The thickness (e.g., length in the Z axis direction of FIG. 7A) of the battery 530 according to an embodiment may be 'L2-3'. The length L2-1 of the battery 530 in the height direction according to an embodiment of the present invention may be larger than the length L1-1 of the battery 530 in the height direction in FIG. 5. For example, the length L2-1 of the battery 530 in the height direction according to an embodiment of the present invention may be about 0.6 mm or more and 0.8 mm or less larger than the length L1-1 of the battery 530 in the height direction in FIG. 5. For example, according to an embodiment of the present invention, the length L2-1 of the battery 530 in the height direction may be about 0.74 mm larger than the length L1-1 of the battery 530 in the height direction in FIG. 5.

Figure 8:
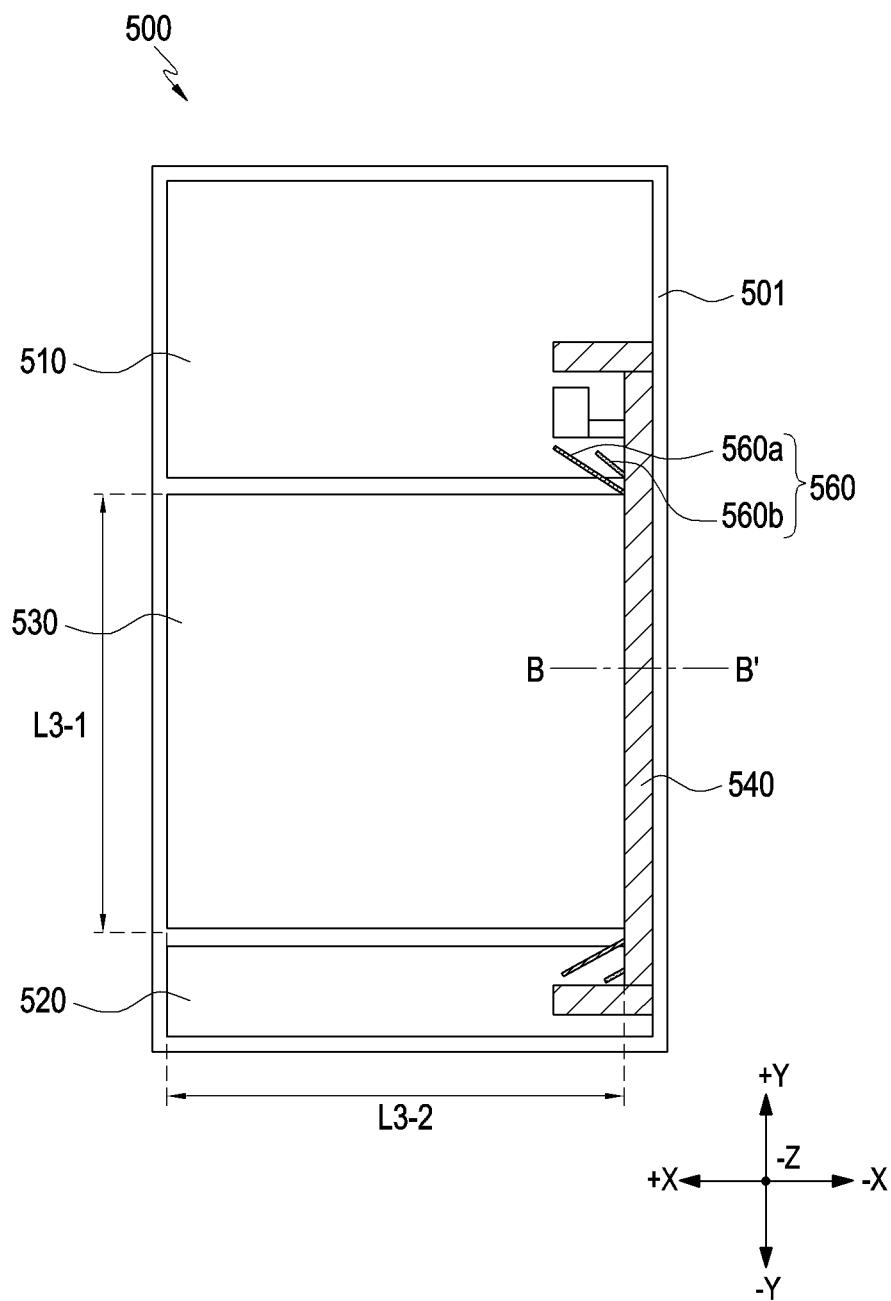
FIG. 8 is an xy-plane rear view illustrating an electronic device according to an embodiment of the disclosure.
Figure 9:
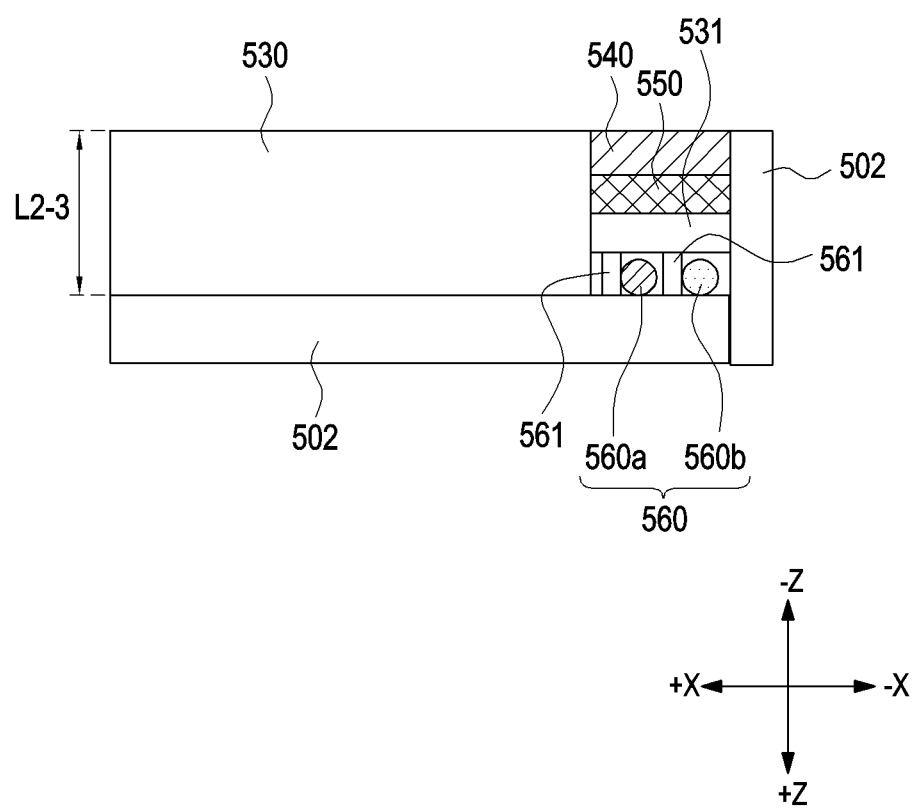
FIG. 9 is a cross-sectional view taken along line B-B' of the electronic device of FIG. 8 according to an embodiment of the disclosure.

FIG. 8 is an xy-plane rear view illustrating an electronic device 500 according to an embodiment of the disclosure. FIG. 9 is a cross-sectional view taken along line B-B' of the electronic device 500 of FIG. 8 according to an embodiment of the disclosure.

Referring to FIGS. 8 and 9, an electronic device 500 may include a housing 501, a first printed circuit board 510 mounted in the housing 501, a second printed circuit board 520, a first flexible printed circuit board 540 connecting the first printed circuit board 510 and the second printed circuit board 520, a battery 530 disposed between the first printed circuit board 510 and the second printed circuit board 520, a protection circuit module (PCM) 550 to previously cut off overcharge, overdischarge, and overcurrent of the battery 530 to protect the battery, and a coaxial cable electrically connecting the first printed circuit board 510 and the second printed circuit board 520.

Referring to FIGS. 8 and 9, the configuration of the first printed circuit board 510, the second printed circuit board 520, the first flexible printed circuit board 540, the battery 530, the protection circuit module 550, and the coaxial cable of FIGS. 8 and 9 may be identical in whole or part to the configuration of the first printed circuit board 510, the second printed circuit board 520, the first flexible printed circuit board 540, the battery 530, the protection circuit module 550, and the coaxial cable of FIGS. 6 to 7B. The structure of FIGS. 8 and 9 may be selectively combinable with the structures of FIGS. 6 to 7B.

FIGS. 8 and 9 illustrate a spatial coordinate system defined by an X-axis, a Y-axis and a Z-axis orthogonal to each other. Here, the X axis may indicate a width direction of the electronic device 500, the Y axis may indicate a length direction (or length direction) of the electronic device 500, and the Z axis may indicate a thickness direction of the electronic device 500.

According to an embodiment, the first flexible printed circuit board 540 may not be disposed over the battery 530. According to an embodiment, the first flexible printed circuit board 540 may be disposed in a position corresponding to the position where the connection member 560 and/or the protection circuit module 550 is disposed. The first flexible printed circuit board 540 may overlap the connection member 560 and/or the protection circuit module 550. The first flexible printed circuit board 540 may be stacked with the connection member 560 and/or the protection circuit module 550. For example, the first flexible printed circuit board 540 may be disposed on the connection member 560 and/or the protection circuit module 550. According to an embodiment, the first flexible printed circuit board 540 may be disposed in the width direction (e.g., the X-axis direction of FIG. 8) of the battery 530 and may overlap the connection member 560 and/or the protection circuit module 550.

According to an embodiment, the thickness of the first flexible printed circuit board 540 in the thickness direction may not exceed a difference between the height of the protection circuit module 550 in the thickness direction and the height of the battery 530 in the thickness direction. The first flexible printed circuit board 540 may have a height of, e.g., about 0.1 mm or more, and 0.2 mm or less. The first flexible printed circuit board 540 may have, e.g., a height of about 0.15. The first flexible printed circuit board 540 may be a multi-layer first flexible printed circuit board 540 composed of several layers.

As the first flexible printed circuit board 540 is disposed to overlap the protection circuit module 550, the battery (530) tab, or the connection member 560, the length of the battery 530 in the thickness direction (e.g., the Z-axis direction of FIG. 8) may not be limited as compared with FIG. 5. As the first flexible printed circuit board 540, the protection circuit module 550, the battery (530) tab, or the connection member 560 is disposed to overlap adjacent in the width direction (e.g., +X-axis direction of FIG. 8) of the battery 530, the battery 530 may be extended in the thickness direction (e.g., Z-axis direction of FIG. 8) of the battery 530.

According to an embodiment, referring to FIGS. 8 and 9, the height (e.g., length in the Y axis direction of FIG. 8) of the battery 530 may be 'L3-1'. The width (e.g., length in the X axis direction of FIG. 8) of the battery 530 according to an embodiment may be 'L3-2'. The thickness (e.g., length in the Z axis direction of FIG. 9) of the battery 530 according to an embodiment may be 'L3-3'. The length L3-3 of the battery 530 in the thickness direction according to an embodiment of the present invention may be larger than the length L1-3 of the battery 530 in the height direction in FIG. 5. For example, the length L3-3 of the battery 530 in the thickness direction according to an embodiment of the present invention may be about 0.15 mm or more and 0.25 mm or less larger than the length L1-3 of the battery 530 in the height direction in FIG. 5. For example, according to an embodiment of the present invention, the length L3-3 of the battery 530 in the thickness direction may be about 0.156 mm larger than the length L1-3 of the battery 530 in the height direction in FIG. 5.

Figure 10:
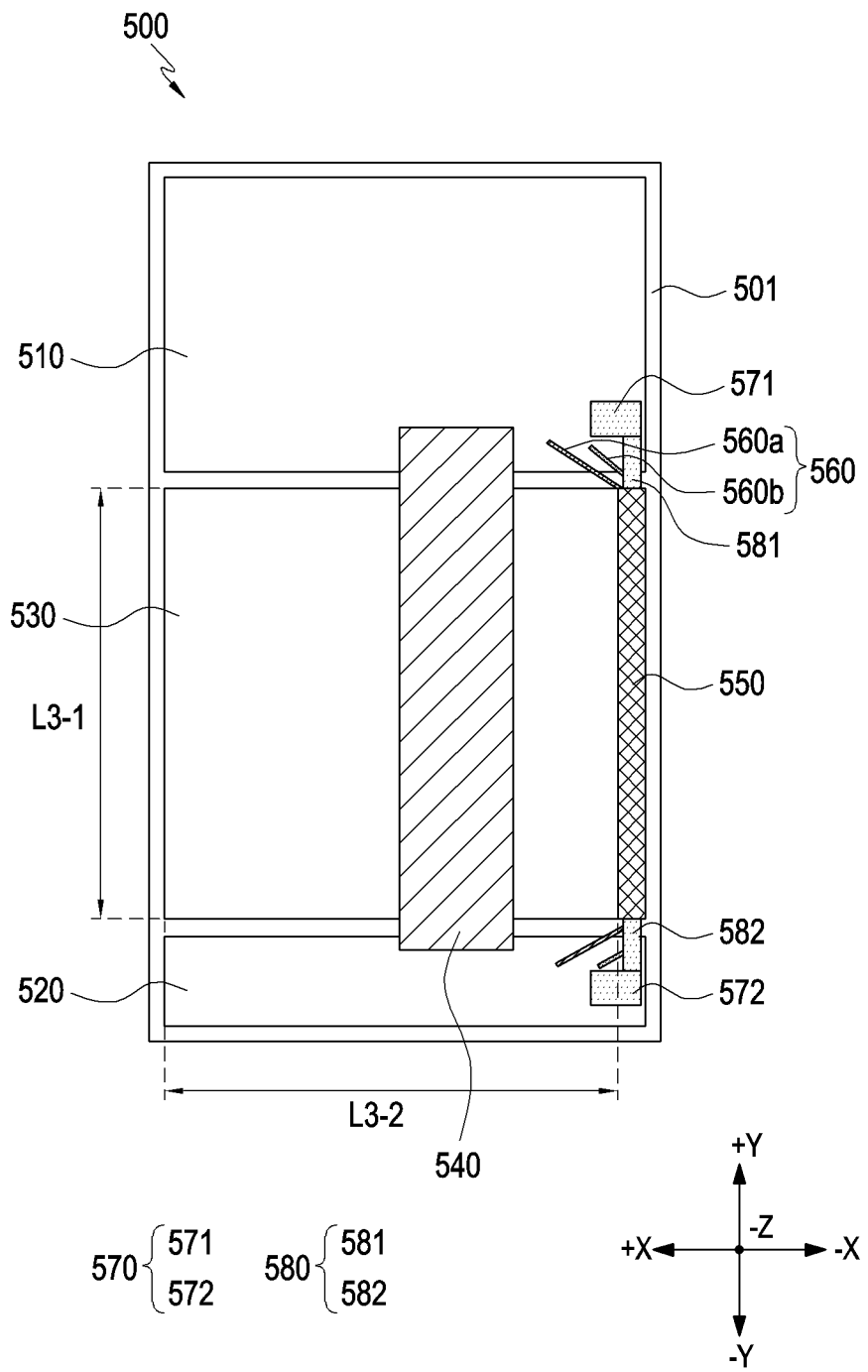
FIG. 10 is an xy-plane rear view illustrating an electronic device according to an embodiment of the disclosure.

FIG. 10 is an xy-plane rear view illustrating an electronic device 500 according to an embodiment of the disclosure.

Referring to FIG. 10, an electronic device 500 may include a housing 501, a first printed circuit board 510 mounted in the housing 501, a second printed circuit board 520, a first flexible printed circuit board 540 connecting the first printed circuit board 510 and the second printed circuit board 520, a battery 530 disposed between the first printed circuit board 510 and the second printed circuit board 520, a protection circuit module (PCM) 550 to previously cut off overcharge, overdischarge, and overcurrent of the battery 530 to protect the battery, and a coaxial cable electrically connecting the first printed circuit board 510 and the second printed circuit board 520.

Referring to FIG. 10, the configuration of the first printed circuit board 510, the second printed circuit board 520, the first flexible printed circuit board 540, the battery 530, the protection circuit module 550, and the coaxial cable of FIG. 10 may be identical in whole or part to the configuration of the first printed circuit board 510, the second printed circuit board 520, the first flexible printed circuit board 540, the battery 530, the protection circuit module 550, and the coaxial cable of FIGS. 8 and 9. The structure of FIG. 10 may be selectively combinable with the structures of FIGS. 8 and 9.

FIG. 10 illustrates a spatial coordinate system defined by an X-axis, a Y-axis and a Z-axis orthogonal to each other. Here, the X axis may indicate a width direction of the electronic device 500, the Y axis may indicate a length direction (or length direction) of the electronic device 500, and the Z axis may indicate a thickness direction of the electronic device 500.

According to an embodiment, sub flexible printed circuit boards 570 may be additionally mounted on two opposite sides of the protection circuit module 550. The sub flexible printed circuit boards 570 may include a first sub flexible printed circuit board 571 connected to one end of the protection circuit module 550 and a 2-2th flexible printed circuit board 572 connected to the other end of the protection circuit module 550. For example, the first sub flexible printed circuit board 571 connected to one end of the protection circuit module 550 disposed in the upper direction (e.g., the +Y direction in FIG. 10) may be connected to the first printed circuit board 510. For example, the 2-2th flexible printed circuit board 572 connected to the other end of the protection circuit module 550 disposed in the lower direction (e.g., the −Y direction in FIG. 10) may be connected to the second printed circuit board 520.

According to an embodiment, the sub flexible printed circuit board 570 may further include a VBAT connecting unit that is a supply voltage that has passed through the battery protection circuit.

In general, when the charging power of the electronic device 500 increases as quick charging is supported, the line width of the VBUS terminal need increase as well. For example, for 45 W charging, the VBUS line width should meet about 6 mm or more and 7 mm or less. However, the line width of the VBUS terminal is limited due to spatial limitations in the electronic device 500. According to an embodiment of the present invention, the first sub flexible printed circuit board 571 and/or the 2-2th flexible printed circuit board 572 may include VBUS charging terminals (vbus usb connector) 581 and 582 for quick charging. By additionally mounting the VBUS terminals 581 and 582 on the first sub flexible printed circuit board 571 and/or the 2-2th flexible printed circuit board 572, quick charging may be effectively supported. According to an embodiment, VBUS may be supplied through a charging terminal (usb connector) mounted on the second printed circuit board 520.

The battery 530 is a device for supplying power to at least one component of the electronic device 500, and may be disposed adjacent to, e.g., the printed circuit board and the protection circuit module (PCM) 550. Mounting of components around the battery 530 may affect the size and capacity of the battery 530. The battery 530 may be disposed on substantially the same plane as the components. According to an embodiment, there may be a wasted area around the battery 530 due to the protection circuit module (PCM) 550 of the electronic device 500. According to an embodiment, the coaxial cable may be loaded on a side of the battery 530 for use of the antenna under the battery 530, and the first flexible printed circuit board 540 may be positioned above the battery 530, so that the length and height of the battery 530 may be limited. According to an embodiment, it may be difficult to support quick charging because the space for the VBUS line for charging is limited.

According to an embodiment of the present invention, the electronic device 500 may minimize the limitations on the space for the battery 530 due to the mounting of the protection circuit module (PCM) 550, connection member 560 (e.g., coaxial cable), and main first flexible printed circuit board 540 to enhance the volume of the battery 530 and provide a VBUS line necessary for quick charging.

According to various embodiments of the disclosure, an electronic device may comprise a housing (501 of FIG. 6); a first printed circuit board (510 of FIG. 6) disposed in the housing; a second printed circuit board (520 of FIG. 6) disposed in the housing; a battery (530 of FIG. 6) disposed between the first printed circuit board and the second printed circuit board; a connection member (560 of FIG. 6) disposed along one side surface of the battery, and electrically connecting the first printed circuit board and the second printed circuit board; a protection circuit module (550 of FIG. 6) disposed along the one side surface of the battery and disposed to overlap over the connection member; and a first flexible printed circuit board (540 of FIG. 6) disposed adjacent to the protection circuit module and connected with the first printed circuit board or the second printed circuit board.

According to an embodiment, the connection member and the protection circuit module may be separated components.

According to an embodiment, the electronic device may further comprise a battery tab disposed under the protection circuit module and including a negative terminal or a positive terminal of the battery mounted thereon.

According to an embodiment, the protection circuit module and the connection member may be disposed along an edge of the electronic device.

According to an embodiment, as the protection circuit module and the connection member may be disposed in a first direction of the battery, the size of the battery is configured to be expanded to a second direction perpendicular to the first direction.

According to an embodiment, the connection member may be disposed on a supporting member. The electronic device may further comprise a guide having a shape in which a portion of the supporting member protrudes to fix a position of the connection member.

According to an embodiment, the connection member may be disposed on a supporting member disposed adjacent to the housing. The electronic device may further comprise a guide having a shape in which a portion of the supporting member is recessed to correspond to a shape of the connection member to fix a position of the connection member.

According to an embodiment, the first flexible printed circuit board may be disposed to be stacked with the protection circuit module.

According to an embodiment, the first flexible printed circuit board may include a plurality of layers.

According to an embodiment, the flexible printed circuit board, the protection circuit module, and the connection member are disposed in a first direction, and the first printed circuit board, the battery, and the second printed circuit board are disposed in a second direction substantially perpendicular to the first direction.

According to an embodiment, the electronic device may further comprise a battery terminal connected to the battery.

According to an embodiment, the electronic device may further comprise a second flexible printed circuit board connected with one end of the protection circuit module and a third flexible printed circuit board connected with another end of the protection circuit module.

According to an embodiment, the second flexible printed circuit board and the third flexible printed circuit board may include a VBUS terminal for charging.

According to certain embodiments of the disclosure, an electronic device may comprise a housing; a first printed circuit board disposed in the housing; a second printed circuit board disposed in the housing; a battery disposed between the first printed circuit board and the second printed circuit board; a connection member disposed along one side surface of the battery, and electrically connecting the first printed circuit board and the second printed circuit board; and a protection circuit module disposed along the one side surface of the battery and overlapping over the connection member.

According to an embodiment, the connection member and the protection circuit module may be separated from each other.

According to an embodiment, the electronic device may further comprise a battery tab disposed under the protection circuit module and having a negative terminal or a positive terminal of the battery mounted thereon.

According to an embodiment, the protection circuit module and the connection member may be disposed along an edge inside of the electronic device.

According to an embodiment, the electronic device may further comprise a second connection member disposed parallel to the connection member, a second guide, wherein the guide contacts the connection member and the second guide contacts the second connection member.

According to an embodiment, the electronic device further comprises a first flexible printed circuit board disposed adjacent to the protection circuit module and connected with the first printed circuit board or the second printed circuit board.

According to an embodiment, as the protection circuit module and the connection member may be disposed in a first direction of the battery, the size of the battery is configured to be expanded to a second direction perpendicular to the first direction.

According to an embodiment, the electronic device may further comprise a first flexible printed circuit board disposed adjacent to the protection circuit module and connected with the first printed circuit board or the second printed circuit board.

According to various embodiments of the disclosure, an electronic device may comprise a housing; a first printed circuit board disposed in the housing; a second printed circuit board disposed in the housing; a battery disposed between the first printed circuit board and the second printed circuit board; a connection member disposed along one side surface of the battery and electrically connecting the first printed circuit board and the second printed circuit board; a protection circuit module disposed along the one side surface of the battery overlapping over the connection member; and a first flexible printed circuit board disposed adjacent to the protection circuit module and connected with the first printed circuit board or the second printed circuit board. The electronic device may further comprise a first flexible printed circuit board connected with one end of the protection circuit module and a second flexible printed circuit board connected with another end of the protection circuit module. The first flexible printed circuit board and the second flexible printed circuit board may include a VBUS terminal.

The invention claimed is:
1. An electronic device comprising:
a housing;
a battery disposed in the housing;
a battery tab disposed at a side in a first lateral direction of the battery;
a first printed circuit board disposed at a side, in a second lateral direction perpendicular to the first lateral direction of the battery;
a second printed circuit board disposed at a side, in a third lateral direction opposite to the second lateral direction of the battery;
a connection member disposed along a side surface, facing in the first lateral direction of the battery, disposed between the first printed circuit board and the second printed circuit board, and configured to electrically connect the first printed circuit board and the second printed circuit board;
a protection circuit module disposed along the one side surface of the battery and electrically connected to the battery tab; and
a first flexible printed circuit board disposed adjacent to the protection circuit module and connected with the first printed circuit board or the second printed circuit board
wherein, when viewed from a thickness direction of the electronic device, the battery tab, the connection member and the protection circuit module are disposed overlapping each other.

2. The electronic device of claim 1, wherein the connection member and the protection circuit module are separated components.

3. The electronic device of claim 1, wherein the battery tab is disposed under the protection circuit module and including a negative terminal or a positive terminal of the battery mounted thereon.

4. The electronic device of claim 1, wherein the protection circuit module and the connection member are disposed along an edge of the electronic device.

5. The electronic device of claim 1, wherein the connection member is disposed on a supporting member, and
wherein the electronic device further comprises a guide protruding from the supporting member, the guide configured to fix a position of the connection member.

6. The electronic device of claim 5, wherein the connection member includes a first connection member and a second connection member disposed parallel to the first connection member,
wherein the guide includes a first guide contacting the first connection member and a second guide contacting the second connection member.

7. The electronic device of any one of claim 1, wherein the connection member is disposed on a supporting member, and
wherein the electronic device further comprises a guide recessed from the supporting member and configured to fix a position of the connection member.

8. The electronic device of claim 1, wherein the first flexible printed circuit board is stacked with the protection circuit module.

9. The electronic device of claim 1, wherein the first flexible printed circuit board includes a plurality of layers.

10. The electronic device of claim 1, wherein the battery tab connected with the battery.

11. The electronic device of claim 1, further comprising a second flexible printed circuit board connected with one end of the protection circuit module and a third flexible printed circuit board connected with another end of the protection circuit module.

12. The electronic device of claim 11, wherein the second flexible printed circuit board and the third flexible printed circuit board include a VBUS terminal for charging.

13. An electronic device comprising:
a housing;
a battery disposed in the housing;
a battery tab disposed at a side in a first lateral direction of the battery;

a first printed circuit board disposed at a side, in a second lateral direction perpendicular to the first lateral direction of the battery;

a second printed circuit board disposed at a side, in a third lateral direction opposite to the second lateral direction of the battery;

a connection member disposed along a side surface, facing in the first lateral direction of the battery, disposed between the first printed circuit board and the second printed circuit board, and configured to electrically connect the first printed circuit board and the second printed circuit board; and a protection circuit module disposed along the one side surface of the battery and electrically connected to the battery tab; and wherein, when viewed from a thickness direction of the electronic device, the battery tab, the connection member and the protection circuit module are disposed overlapping each other.

14. The electronic device of claim 13, wherein the connection member and the protection circuit module are separated from each other.

15. The electronic device of claim 13, wherein the battery tab is disposed under the protection circuit module and having a negative terminal or a positive terminal of the battery mounted thereon.

16. The electronic device of claim 13, wherein the protection circuit module and the connection member are disposed along an edge inside the electronic device.

17. The electronic device of any one of claim 13, wherein the connection member includes a first connection member and a second connection member disposed parallel to the first connection member, wherein the electronic device further comprises a guide comprising a first guide contacting the first connection member and a second guide contacting the second connection member.

18. The electronic device of claim 13, further comprising a first flexible printed circuit board disposed adjacent to the protection circuit module and connected with the first printed circuit board or the second printed circuit board.

19. An electronic device comprising:

a housing;

a battery disposed in the housing;

a battery tab disposed at a side in a first lateral direction of the battery;

a first printed circuit board disposed at a side, in a second lateral direction perpendicular to the first lateral direction of the battery;

a second printed circuit board disposed at a side, in a third lateral direction opposite to the second lateral direction of the battery;

a connection member disposed along a side surface, facing in the first lateral direction of the battery, disposed between the first printed circuit board and the second printed circuit board, and configured to electrically connect the first printed circuit board and the second printed circuit board;

a protection circuit module disposed along the one side surface of the battery and electrically connected to the battery tab; and a first flexible printed circuit board disposed adjacent to the protection circuit module and connected with the first printed circuit board or the second printed circuit board, wherein, when viewed from a thickness direction of the electronic device, the battery tab, the connection member and the protection circuit module are disposed overlapping each other and wherein the electronic device further comprises a first flexible printed circuit board connected with one end of the protection circuit module and a second flexible printed circuit board connected with another end of the protection circuit module, and wherein the first flexible printed circuit board and the second flexible printed circuit board include a VBUS terminal.

* * * * *